(12) United States Patent
Henckens et al.

(10) Patent No.: US 12,460,109 B2
(45) Date of Patent: Nov. 4, 2025

(54) ELECTRICALLY CONDUCTIVE SILICONE COMPOSITION WITH HIGH ADHESION STRENGTH

(71) Applicant: Henkel AG & Co. KGaA, Duesseldorf (DE)

(72) Inventors: Anja Henckens, Zonhoven (BE); Elisabeth Theunissen, Wilsele (BE); Jing Yang, Shanghai (CN); Yazhou Zhang, Shanghai (CN); Yifan Chen, Shanghai (CN)

(73) Assignee: Henkel AG & Co. KGaA, Duesseldorf (DE)

( * ) Notice: Subject to any disclaimer, the term of this patent is extended or adjusted under 35 U.S.C. 154(b) by 213 days.

(21) Appl. No.: 17/589,549

(22) Filed: Jan. 31, 2022

(65) Prior Publication Data

US 2022/0154046 A1    May 19, 2022

Related U.S. Application Data

(63) Continuation of application No. PCT/CN2019/098523, filed on Jul. 31, 2019.

(51) Int. Cl.
| | |
|---|---|
| *C09J 9/02* | (2006.01) |
| *C08G 77/00* | (2006.01) |
| *C08G 77/50* | (2006.01) |
| *C08K 3/08* | (2006.01) |
| *C09J 5/00* | (2006.01) |

(Continued)

(52) U.S. Cl.
CPC ............... *C09J 9/02* (2013.01); *C08G 77/50* (2013.01); *C08K 3/08* (2013.01); *C09J 5/00* (2013.01); *C09J 183/14* (2013.01); *H10F 19/906* (2025.01); *C08G 77/80* (2013.01);

(Continued)

(58) Field of Classification Search
CPC . H01L 31/05–0516; C09J 183/14; C09J 9/02; H10F 19/906
See application file for complete search history.

(56) References Cited

U.S. PATENT DOCUMENTS

| | | |
|---|---|---|
| 7,326,369 B2 | 2/2008 | Cheng |
| 9,543,460 B2 | 1/2017 | DeSantis |

(Continued)

FOREIGN PATENT DOCUMENTS

| | | |
|---|---|---|
| CN | 101412851 A | 4/2009 |
| CN | 103571428 A | 2/2014 |

(Continued)

OTHER PUBLICATIONS

M. Estruga, et al.; Electrically Conductive Adhesives for Cell Interconnection in Shingled Module Technology: The Impact of Material Properties on Mini-module Performance, Proceedings of the 35th EUPVSEC 2018, Brussels, Belgium, pp. 67-70.

(Continued)

*Primary Examiner* — Lindsey A Buck
(74) *Attorney, Agent, or Firm* — Steven C. Bauman

(57) ABSTRACT

The present invention relates to an electrically conductive composition comprising a silicone resin comprising at least one vinyl-group; a silicone cross-linker having at least one Si—H group; electrically conductive particles; a solvent; an adhesion promoter; a catalyst; and an inhibitor, wherein ratio between Si—H groups and vinyl-groups is equal or greater than 1.3 but equal or less than 10.

11 Claims, 2 Drawing Sheets a b (51) Int. Cl.
*C09J 183/14* (2006.01)
*H10F 19/90* (2025.01)

(52) U.S. Cl.
CPC .............. *C08K 2003/0806* (2013.01); *C08K 2201/001* (2013.01); *C09J 2483/00* (2013.01)

(56) References Cited

U.S. PATENT DOCUMENTS

| | | | | |
|---|---|---|---|---|
| 2015/0034141 | A1* | 2/2015 | Albaugh | H01L 31/02008 252/512 |
| 2017/0200837 | A1* | 7/2017 | Raskar | H01L 31/00 |
| 2017/0323995 | A1* | 11/2017 | Gislon | H01L 31/0504 |
| 2020/0347229 | A1* | 11/2020 | Fujisawa | H05K 5/065 |

FOREIGN PATENT DOCUMENTS

| | | |
|---|---|---|
| CN | 107189445 A | 9/2017 |
| CN | 107406677 A | 11/2017 |
| CN | 107955582 A | 4/2018 |
| EP | 3401928 A1 | 11/2018 |
| WO | 2010/000096 | 1/2010 |
| WO | 2012166870 A1 | 12/2012 |
| WO | 2013/041568 | 3/2013 |
| WO | 2014105974 A1 | 7/2014 |
| WO | 2016138660 A1 | 9/2016 |
| WO | WO-2018043270 A1 * | 3/2018 ............ C08G 77/08 |

OTHER PUBLICATIONS

N. Klasen, et al.; "Shingled Cell Interconnection: A new Generation of Bifacial PV-Modules", 7th Workshop on Metallization and Interconnection for Crystalline Silicon Solar Cells (2018).

N. Wöhrle, et al.; "Solar cell demand for bifacial and singulated-cell module architectures", Photovoltaic International 36, pp. 48-60 (2017).

D. Tonini, et al., "Shingling Technology for Cell Interconnection: Technological Aspects and Process Integration", Proceedings of the 33rd EUPVSEC, Amsterdam, The Netherlands, pp. 38-41 (2017).

L. Theunissen, B. Willems, et al., "Electrically Conductive Adhesives as Cell Interconnection Material in Shingled Module Technology", AIP Conference Proceedings, https://doi.org/10.1063/1.5049305.

G. Beaucarne, "Materials Challenge for Shingled Cells Interconnection," Energy Procedia, vol. 98, pp. 115-124, (2016).

PCT International Search Report issued in connection with International Patent Application No. PCT/CN2019/098523—Mailing date: Apr. 26, 2020.

* cited by examiner

ELECTRICALLY CONDUCTIVE SILICONE COMPOSITION WITH HIGH ADHESION STRENGTH

TECHNICAL BACKGROUND OF THE INVENTION

The present invention relates to an electrically conductive silicone composition for attaching solar cells together, preferably in a shingled photovoltaic module, wherein the adhesive has required electrical and mechanical properties.

BACKGROUND

Figure 1:
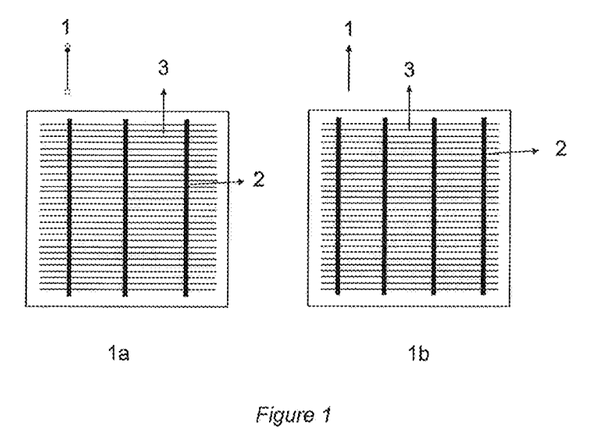
FIG. 1 illustrates a structure of ordinary silicon solar cells.
Figure 2:
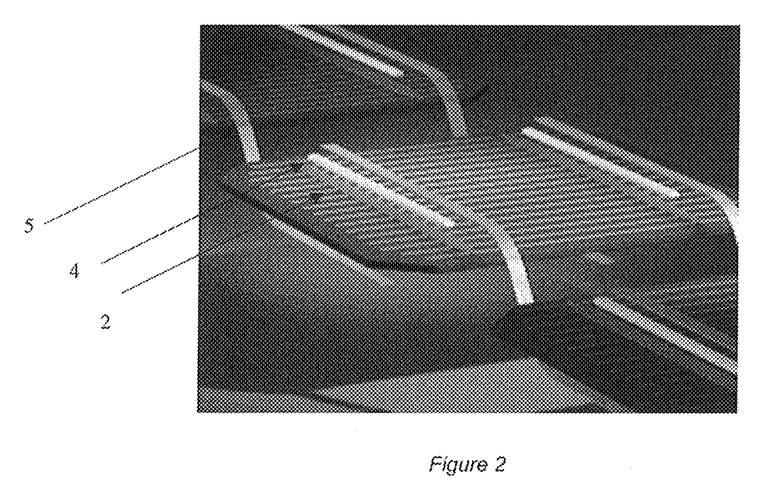
FIG. 2 illustrates a conventional photovoltaic module.

A solar cell or photovoltaic cell is an electrical device that converts the energy of light directly into electricity by the photovoltaic effect. Solar cells are the building blocks of the photovoltaic modules, otherwise known as solar panels, in order to increase the voltage delivered by individual solar cells. The general structure of a solar cell is illustrated in FIG. 1. Most of the solar cells (1) produced today consist of crystalline silicon. Metal contacts, busbars (2) and fingers (3), are both printed on the silicon wafer. These metallic contacts are necessary to collect the current generated by a solar cell. FIG. 1a illustrates basic configuration with three busbars and FIG. 1b illustrates basic configuration with four busbars (these figures are for illustration purposes only, and different designs with different number of busbars and/or fingers are possible). Fingers are linear areas of metallization that collect current to deliver it to the busbars, which are connected directly to the external leads, via ribbons (5) for example. A conventional solar cell, including ribbons (5) is illustrated in FIG. 2. In a conventional photovoltaic module, high temperature firing pastes are used as finger and busbar material, and the ribbons (5) are attached by means of a soldering process. In addition to soldering, electrically conductive adhesives (4) can be used to bond standard cells, especially heat sensitive heterojunction (or thin (<150 micron)) crystalline silicon cells. The ribbons are on top of the bus bars in the conventional photovoltaic module and may cause a shadow area to the solar cell leading to decrease the efficiency of the photovoltaic module.

A way to circumvent the latter issue, is to produce back contact cells with no or very limited amount of metal contacts on the front side. Examples of such cells are metal wrap through (MWT) solar cells or interdigitated back contact (IBC) solar cells. Electrically conductive adhesives can be used to connect such cells into a module. This can be done by ribbons as described above wherein the ribbons are only on the back. In another back-contact module design, the electrically conductive adhesive can be applied in a patterned way on the back side of the cell or on a conductive back sheet and as such electrically interconnecting the cell and the conductive back sheet together.

Figure 3:
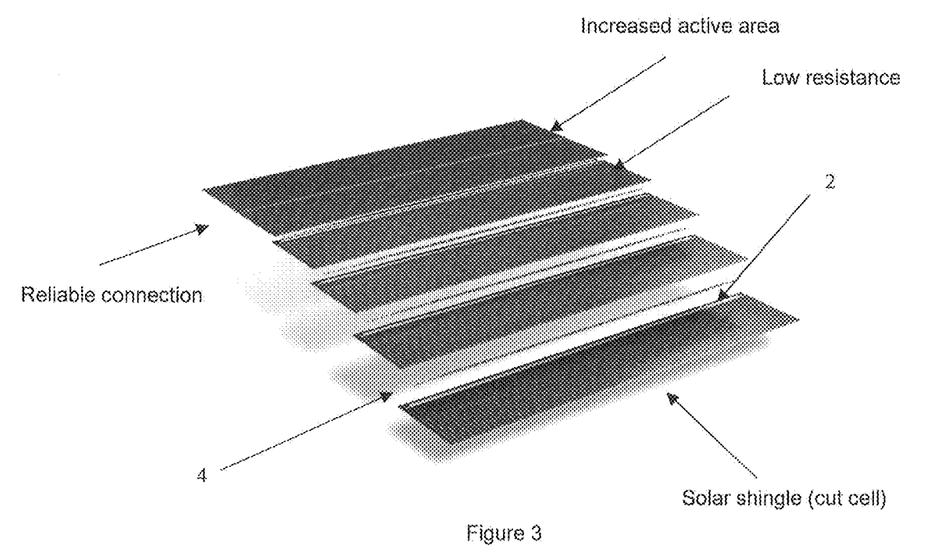
FIG. 3 illustrates a shingled photovoltaic module.

A more effective way to increase the power output of the conventional photovoltaic modules is to arrange solar cells in series-connected in an overlapping shingle pattern. Shingles are typically made by cutting/dicing crystalline silicon cells along a plurality of lines parallel to a long edge of each wafer to form a plurality of rectangular silicon solar cells each having substantially the same length along its long axis. In this way more shingles (typically 5 or 6 for a six-inch wafer (approx. 156 mm)) are cut/diced from the original cell. The cells can be full square as well as pseudo-square, in the latter, cut cells with chamfered corners may be obtained. The first and second silicon solar cells are bonded to each other front to back at the overlapping portions of the solar cells with an electrically conductive material (4) in shingle structure. The conductive material can be deposited in different patterns. Electrically conductive adhesive as a material to bond the solar cells together have the advantage that they overcome mechanical stresses, which build up due to CTE (coefficient of thermal expansion) mismatch between the different materials used in a photovoltaic assembly. FIG. 3 illustrates a shingled photovoltaic module. In this figure shingles with busbars (2) are depicted but also cell structures with interrupted busbars, pseudo busbars or even no busbars are possible with the use of an electrically conductive adhesive as the latter can collect the current generated from the photovoltaic cell.

Prior art describes various kind of electrically conductive adhesives, which can be used to interconnect solar cells to form photovoltaic modules. Many of these electrically conductive adhesives are epoxy, acrylate or silicone-based adhesives. However, they might either not have the correct mechanical properties to overcome the stresses created in reliability e.g. in thermal cycling between temperatures of −40° C. and 85° C. (also described in detail below) or they might not have a sufficiently high adhesion strength.

The photovoltaic modules are subjected to a temperature changes and high mechanical stresses over their life cycle. These factors have a negative effect on the lifetime of the photovoltaic module and set requirements for the electrically conductive adhesive used on the solar cells and/or in the photovoltaic modules.

Required mechanical properties for the electrically conductive adhesive composition are correct modulus, specified glass transition temperature, and specified coefficient of thermal expansion in order to pass the thermo-mechanical load reliability test designed for the photovoltaic modules. If the adhesive material is too rigid (too high modulus) the power output loss of the photovoltaic module may occur when applying external stresses to the module (e.g. after application of mechanical load or after thermal cycling).

Therefore, there is still a need for an electrically conductive adhesive composition, which has improved initial, as well as long-term, bonding strength (long-term adhesion) with low bulk and contact resistivity, in particular, if such components and/or substrates will undergo temperature changes during their lifecycle. Furthermore, there is also a need for flexible electrically conductive adhesive that can be applied with high speed e.g. screen or stencil printing or jet, time pressure or auger dispensing.

SUMMARY OF THE INVENTION

The present invention relates to an electrically conductive composition comprising a) a silicone resin comprising at least one vinyl-group; b) a silicone cross-linker having at least one Si—H group; c) electrically conductive particles; d) a solvent; e) an adhesion promoter; f) a catalyst; and g) an inhibitor, wherein ratio between Si—H groups and vinyl-groups is equal or greater than 1.3 but equal or less than 10.

The present invention also relates to a cured product of the electrically conductive composition according to the present invention.

The present invention encompasses use of the electrically conductive composition according to the present invention or the cured product on a solar cell and/or in a photovoltaic module.

The present invention also encompasses a photovoltaic module, comprising a series-connected string of two or more solar cells in a shingle pattern having an electrically conductive bonding between said two or more solar cells, wherein said electrically conductive bonding is formed with an electrically conductive composition according to the present invention.

DETAILED DESCRIPTION OF THE INVENTION

In the following passages the present invention is described in more detail. Each aspect so described may be combined with any other aspect or aspects unless clearly indicated to the contrary. In particular, any feature indicated as being preferred or advantageous may be combined with any other feature or features indicated as being preferred or advantageous.

In the context of the present invention, the terms used are to be construed in accordance with the following definitions, unless a context dictates otherwise.

As used herein, the singular forms "a", "an" and "the" include both singular and plural referents unless the context clearly dictates otherwise.

The terms "comprising", "comprises" and "comprised of" as used herein are synonymous with "including", "includes" or "containing", "contains", and are inclusive or open-ended and do not exclude additional, non-recited members, elements or method steps.

The recitation of numerical end points includes all numbers and fractions subsumed within the respective ranges, as well as the recited end points.

All percentages, parts, proportions and then like mentioned herein are based on weight unless otherwise indicated.

When an amount, a concentration or other values or parameters is/are expressed in form of a range, a preferable range, or a preferable upper limit value and a preferable lower limit value, it should be understood as that any ranges obtained by combining any upper limit or preferable value with any lower limit or preferable value are specifically disclosed, without considering whether the obtained ranges are clearly mentioned in the context.

All references cited in the present specification are hereby incorporated by reference in their entirety.

Unless otherwise defined, all terms used in disclosing the invention, including technical and scientific terms, have the meaning as commonly understood by one of the ordinary skill in the art to which this invention belongs to. By means of further guidance, term definitions are included to better appreciate the teaching of the present invention.

An electrically conductive composition according to the present invention comprises a) a silicone resin comprising at least one vinyl-group; b) a silicone cross-linker having at least one Si—H group; c) electrically conductive particles; d) a solvent; e) an adhesion promoter; f) a catalyst; and g) an inhibitor, wherein ratio between Si—H groups and vinyl-groups is equal or greater than 1.3 but equal or less than 10.

The advantage of using electrically conductive adhesives on a solar cell and/or in a photovoltaic module is that they can be used in combination with heat sensitive cells such as heterojunction crystalline silicon cell that have a a-Si layer present or facilitate the use of thinner cells as they are a lower stress interconnection compared to a soldered interconnection.

The Applicant has found out that a high adhesion strength in combination with electrical stability in reliability can be achieved by an electrically conductive composition according to the present invention. The Applicant has found out that by lowering the quantity of electrically conductive particles and increasing the quantity of the resin matrix accumulated mechanical stress problems in solar modules can be overcome. The composition according to the present invention has a high adhesion strength while providing stable electrical contact between two solar cells and stable electrical performance during durability tests under conditions such as −40-85° C. and 85° C./85% RH. In addition, the composition according to the present invention have improved performance compared to non-silicone adhesives in flexibility and stress release.

Thermoset resins have the advantage that they can vary from very rigid to very flexible materials. Although, material cannot be too flexible, because too flexible material has adversary effect on stable electrical contact. Especially contact resistance of the adhesive used in the solar panels tends to increase during thermocycling between −40° C. and 85° C. and/or during ageing at 85° C. in high humidity (85%).

An electrically conductive adhesive according to the present invention comprises a silicone resin comprising at least one vinyl group. Suitable silicone resin comprising at least one vinyl-group for use in the present invention has preferably a weight molecular weight ($M_w$) from 200 to 100000 dalton (Da), wherein the molecular weight is measured by Gel Permeation Chromatography (GPC). The GPC test method is described in detail in the examples section below.

In the formulas 1-7, the different siloxane subunits a-j and x are not necessarily present in the order illustrated herein. The subunits a-j and x can be randomly distributed in the siloxane backbone in every possible combination.

Suitable silicone resin comprising at least one vinyl-group for use in the present invention is preferably selected from the group consisting of (1)

wherein a is 1-1000, preferably 2-650 and $R_1$, $R_2$, $R_3$, $R_4$ are same or different and independently selected from the group consisting of methyl-group, ethyl-group and phenyl-group, preferably selected from methyl-group and phenyl-group;

(2)

wherein b+c+x is 1-1000, preferably 2-650 and $R_5$, $R_6$, $R_7$, $R_8$, $R_9$ and $R_{10}$ are same or different and independently selected from the group consisting of methyl-group and ethyl-group, phenyl-group, preferably selected from methyl-group and phenyl-group;

(3)

wherein d+e is 1-1000, preferably 2-650 and $R_{11}$, $R_{12}$, $R_{13}$, $R_{14}$, $R_{15}$, $R_{16}$, $R_{17}$ are same or different and independently selected from the group consisting of methyl-group, ethyl-group and phenyl-group, preferably selected from methyl-group and phenyl group;

(4)

wherein f is 1-1000, preferably 2-650 and $R_{18}$, $R_{19}$, $R_{20}$, $R_{21}$, $R_{22}$, $R_{23}$, $R_{24}$, $R_{25}$, $R_{26}$, $R_{27}$, $R_{28}$ are same or different and independently selected from the group consisting of methyl-group, ethyl-group and phenyl-group, preferably selected from methyl-group and phenyl-group;

(5)

wherein g+h is 1-1000, preferably 2-650 and $R_{29}$, $R_{30}$, $R_{31}$, $R_{32}$ are same or different and independently selected from the group consisting of methyl-group and phenyl-group;

(6)

wherein R' is selected from the group consisting of vinyl, methyl-group, ethyl-group, phenyl-group and mixtures thereof, R" is selected from the group consisting of methyl-group, ethyl-group, phenyl-group, vinyl-group and mixtures thereof, wherein at least one R" is vinyl-group, preferably R' is methyl-group, and R" is methyl-group, vinyl-group and mixtures thereof, wherein at least one R" is vinyl-group;

(7)

wherein i+j is 1-1000, preferably 2-650 and $R_{33}$, $R_{34}$, $R_{35}$, $R_{36}$, $R_{37}$, $R_{36}$, $R_{39}$, $R_{40}$, $R_{41}$ are same or different and independently selected from the group consisting of methyl-group and phenyl-group;
and mixtures thereof.

Suitable commercially available silicone resins comprising at least one vinyl-group for use in the present invention include but are not limited to Silopren U grundmishung H6 from Momentive Performance Materials, Andisil VQM 1, Andisil VQM 2050 and Andisil VQM 6 from AB specialty silicones and Silmer VQ20 from Siltech corporation.

A silicone resin comprising at least one vinyl-group may be present in an electrically conductive adhesive according to the present invention in an amount of from 10 to 70% by weight of the total weight of the composition, preferably from 11 to 50%, and more preferably from 12 to 35%.

If the quantity of a silicone resin comprising at least one vinyl-group is greater than 70%, the electrical conductivity levels may not be high enough, whereas quantity lower than 10% may lead to a polymer matrix, which is not strong enough meaning that the adhesion strength may be too low, and/or the composition may have too high viscosity which have a negative impact on applicability of the composition.

An electrically conductive adhesive according to the present invention comprises a silicone cross-linker having at least one Si—H group. Suitable silicone crosslinker comprising at least one Si—H group for use in the present invention has preferably a weight molecular weight ($M_w$) from 200 to 100000 dalton (Da), wherein the molecular weight is measured by GPC. The GPC test method is described in detail in the examples section below.

In the formulas 8-14, the different siloxane subunits k-s are not necessarily present in the order illustrated herein. The subunits k-s can be randomly distributed in the siloxane backbone in every possible combination.

Suitable silicone cross-linker having at least one Si—H group for use in the present invention is preferably selected from the group consisting of (8)

wherein k is 1-1000, preferably 2-650 and $R_{42}$ and $R_{43}$ are same or different and independently selected from the group consisting of H, methyl-group, ethyl-group and phenyl-group, preferably selected from methyl-group and phenyl-group;

(9)

wherein I is 1-1000, preferably 2-650 and $R_{44}$ is selected from the group consisting of H, methyl-group, ethyl-group, phenyl-group and mixtures thereof, preferably selected from methyl-group, phenyl-group and mixtures thereof;

(10)

(11)

wherein m is 1-1000, preferably 2-650;

(12)

wherein n+o is 1-1000, preferably 2-650 and $R_{45}$, $R_{46}$, $R_{47}$ are same or different and independently selected from the group consisting of H, methyl-group, ethyl-group and phenyl-group, preferably selected from methyl-group and phenyl-group;

(13)

wherein p+q is 1-1000, preferably 2-650 and $R_{48}$ and $R_{49}$ are same or different and selected from the group consisting of H, methyl-group, ethyl-group and phenyl-group, preferably selected from methyl-group and phenyl-group;

(14)

wherein r+s is 1-1000, preferably 2-650 and $R_{50}$, $R_{51}$, $R_{52}$, $R_{53}$, $R_{54}$, $R_{55}$, $R_{56}$, $R_{57}$, $R_{58}$, $R_{59}$, $R_{60}$, $R_{61}$ are same or different and independently selected from the group consisting of H, methyl-group, ethyl-group and phenyl-group, preferably selected from methyl-group and phenyl-group; and mixtures thereof.

Suitable commercially available silicone cross-linkers having at least one Si—H group for use in the present invention include but are not limited to Silopren U vernetzer 430 from Momentive Performance Materials, Silmer HQ20 from Siltech corporation, HQM-105 and HQM-107 from Gelest, SYL-OFF™ SL 7028 Crosslinker and SYL-OFF™ SL 7672 crosslinker from Dow Corning.

A silicone crosslinker comprising at least one Si—H group may be present in an electrically conductive adhesive according to the present invention in an amount of from 0.1 to 30% by weight of the total weight of the composition, preferably from 0.5 to 20%, and more preferably from 0.5 to 16%.

If the quantity of the silicone crosslinker is less than 0.1%, the crosslink density and strength of the composition may be too low, whereas if the quantity is greater than 30%, the composition may be too rigid and brittle.

The ratio between Si—H groups and vinyl-groups is equal or greater than 1.3 but equal or less than 10, preferably the ratio is from 1.4 to 10, more preferably from 1.4 to 5 and even more preferably from 1.4 to 3. Within this range the composition according to the present invention has a good balance between adhesion strength and electrical properties.

An electrically conductive composition according to the present invention comprise electrically conductive particles.

Suitable electrically conductive particles for use in the present invention are selected from the group consisting of silver, nickel, carbon, carbon black, graphite, graphene, copper, gold, platinum, aluminium, iron, zinc, cobalt, lead, tin alloys, silver coated copper, silver coated graphite, silver coated polymers, silver coated aluminium, silver coated glass, silver coated carbon, silver coated boron nitride, silver coated aluminium oxide, silver coated aluminium hydroxide and mixtures thereof, preferably electrically conductive particles are selected from the group consisting of silver, carbon black, graphite, graphene, copper, silver coated copper, silver coated graphite, silver coated polymers, silver coated aluminium, silver coated glass, silver coated carbon, silver coated boron nitride, silver coated aluminium oxide, silver coated aluminium hydroxide and mixtures thereof, more preferably electrically conductive particles are selected from the group consisting of silver, silver coated copper, silver coated graphite, silver coated polymers, silver coated aluminium, silver coated glass and mixtures thereof, most preferably electrically conductive particles are silver.

The shape of the suitable electrically conductive particles for use in the present invention may be a flake shape, powder shape, platelet shape or a mixture thereof.

In highly preferred embodiment the electrically conductive particles are a mixture of flake shape particles and powder shape particles.

The Applicant has found out that the combination of flake shape and powder will provide better electrical conductivity performance.

Generally, the flake shape particles and platelet shape particles have different particle size than powder, however, particle sizes overlap, meaning that some of the flake or platelet shape particles are same size as the powder shape particles.

In a preferred embodiment, the electrically conductive particles have a maximum particle size of 100 micron, preferably a particle size from 0.4 to 100 micron, more preferably from 0.45 to 80 microns, even more preferably from 0.5 to 65 microns.

Particle size is measured by using particle size distribution (PSD) method. The average particle size is measured in the present invention through laser diffractometry preferably using a Malvern Mastersizer 2000 or Malvern Mastersizer 3000 available from Malvern Instruments Ltd. or Horiba LA-950V2 from Horiba Ltd. In this technique, the size of particles in suspensions or emulsions is measured using the diffraction of a laser beam, based on application of either Fraunhofer or Mie theory. In the present invention, Mie theory or a modified Mie theory for non-spherical particles is applied and the particle sizes relate to scattering measurements at an angle from 0.02 to 135 degrees relative to the incident laser beam.

Suitable commercially available electrically conductive particles for use in the present invention include but are not limited to AA192N, GA23825, K1332P, AA-4077, AA-3462, AAM-54314 and RA 0076 from Metalor, and KP 29, KP74, KP84, SF 22, SF 25, SF 134 and XJ 12 from Ames Goldsmith corporation and Silflake 95-237 from Technic, Inc.

An electrically conductive particles may be present in an electrically conductive adhesive according to the present invention in an amount of from 30 to 75% by weight of the total weight of the composition, preferably from 50 to 70% and more preferably from 54 to 69%.

When the quantity of the electrically conductive particles is greater than 75% balance between the electrically conductive particles and the resin may not be ideal, and therefore, the electrical stability in reliability may not be ideal either. In addition, high particle quantity increases the costs of the adhesive. Whereas quantity less than 30% may lead to a poor electrical conductivity performance.

An electrically conductive composition according to the present invention comprise an adhesion promoter.

Suitable adhesion promoter for use in the present invention is selected from the group consisting of epoxy functional silanes, cycloaliphatic epoxy silanes, (meth)acrylic functional silanes, carboxylates, and mixtures thereof.

Suitable commercially available adhesion promoters for use in the present invention include but are not limited to Silane Xiameter OFS-6040 or DOW CORNING® Z-6040 SILANE, DOW CORNING® Z-6341 SILANE from Dow corning, Silquest A187, Siquest A186, Silquest A174, Silquest A171 from Momentive Performance Materials, Blemmer GS from Nippon Oil & Fat Corporation (NOF) and KH-570 from Qingdao Hengda Zhong Cheng Technology Co.

An adhesion promoter may be present in an electrically conductive adhesive according to the present invention in an amount of from 0.05 to 2.5% by weight of the total weight of the composition, preferably from 0.1 to 2% and more preferably from 0.2 to 0.8%.

When the quantity of the adhesion promoter is greater than 2.5% the adhesive may show some bleeding, whereas quantity less than 0.05% may lead to a poor adhesion promotion.

An electrically conductive composition according to the present invention comprises a solvent wherein said solvent has a boiling point 75° C. or greater at 1 atm (760 mm Hg).

Solvents having boiling point 75° C. or greater are preferred because solvents having lower boiling point would evaporate from the composition during assembly and the use, and therefore, would have a negative impact on the properties of the composition.

Preferably the solvent suitable for use in the present invention is selected from the group consisting of solvents with general structure $R_{62}(Si(R_{62})_2O)_tR_{62}$ wherein $R_{62}$ is C1-C10 alkyl chain, carbitol acetate, polycarbitol acetate, butylcarbitol acetate, hydrotreated light distillate (petroleum), and mixtures thereof and t is an integer from 1 to 10, preferably solvent is selected from the group consisting of polysilicate, methyl polysilicate, ethyl polysilicate, butyl polysilicate, carbitol acetate, polycarbitol acetate, butylcarbitol acetate, hydrotreated light distillate (petroleum), and mixtures thereof.

Suitable commercially available solvents for use in the present invention include but are not limited to butylcarbitol acetate (BCA) from Dow Chemical, Solvent Oil D60 from Miosonio Co. Ltd., D60 from Redox Pty Ltd, Silbond 40 from Silbond Corporation and Dynasyl 40 from Evonik.

A solvent may be present in an electrically conductive adhesive composition according to the present invention in an amount of from 0.1 to 10% by weight of the total weight of the composition, preferably from 0.15 to 5% and more preferably from 0.2 to 4%.

If the quantity of the solvent is too high, this may lead to poor adhesion properties, high amounts of out-gassing during cure and composition bleeding whereas quantity lower than 0.1% may lead to no desired effect and too high viscosity.

An electrically conductive composition according to the present invention comprises a catalyst.

Suitable catalyst for use in the present invention is selected from the group consisting of platinum complex catalysts, rhodium complex catalysts and mixtures thereof, preferably the catalyst is platinum complex catalysts, and more preferably the catalyst is selected from the group consisting of platinum-divinyltetramethyldisiloxane complex, $H_2PtCl_6 \cdot [Cp_2PtCl_2]$, Pt carbonyl cyclovinylmethylsiloxane complex; Pt—cyclovinyl methylsiloxane complex and mixtures thereof.

Suitable commercially available catalyst for use in the present invention include but are not limited to SIP 6829.2 and SIP 6831.2 from Gelest.

A catalyst may be present in an electrically conductive adhesive according to the present invention in an amount of from 0.01 to 2% by weight of the total weight of the composition, preferably from 0.05 to 1% and more preferably from 0.07 to 0.5%.

If the quantity of the catalyst is lower than 0.01% this may lead to no reaction, and poor adhesion and cure properties, whereas quantity greater than 2% may lead to high costs and brittle cured product.

An electrically conductive composition according to the present invention comprises an inhibitor. It is noted that it is difficult to asses the presence of the inhibitor in a composition according to the present invention by analytical methods.

Suitable inhibitor for use in the present invention is selected from the group consisting of HC≡C—C(OH)$R_{63}R_{64}$, wherein $R_{63}$ is methyl, ethyl, and $R_{64}$ is linear or branched alkyl chain having from 1 to 10 carbon atoms or phenyl group or functionalised phenyl group; HC≡C—C(CH$_3$)═CHR$_{65}$, wherein Res is linear or branched alkyl chain having from 1 to 10 carbon atoms; tetravinyl-tetrymethylcyclo-tetrasiloxane, bis(2-ethylhexyl)maleate and mixtures thereof, preferably the inhibitor is selected from the group consisting of 2-methyl-3-butyn-2-ol, 2-phenyl-3-butyn-2-ol, 3-methyl-3-penten-1-yne, 3,5-dimethyl-3-hexen-1-yne, tetravinyl-tetrymethylcyclo-tetrasiloxane, 1-ethynyl-1-cyclohexanol, 3,5-dimethyl-1-hexyn-3-ol, bis(2-ethylhexyl)maleate and mixtures thereof.

Suitable commercially available inhibitor for use in the present invention include but are not limited to 2-methyl-3-butyn-2-ol from Acros, 3,5-dimethyl-1-hexyn-3-ol from Sigma Aldrich, and bis(2-ethylhexyl) maleate from Celanese and vinyl-methyl-D4 from Momentive.

An inhibitor may be present in an electrically conductive adhesive according to the present invention in an amount of from 0.01 to 2% by weight of the total weight of the composition, preferably from 0.05 to 1% and more preferably from 0.07 to 0.5%.

If the quantity of the inhibitor is too high, this may lead to no reaction at all and poor adhesion properties. Too low inhibitor concentrations on the other hand may lead to short work life and shelf life of the material.

An electrically conductive composition according to the present invention may further comprise rheological additives, conductivity promotors, dispersing agents, anti-bleed agents, defoamers and mixtures thereof.

In a highly preferred embodiment, the electrically conductive composition according to the present invention comprises a rheological additive selected from the group consisting of quartz, fumed silica, clay, polyamides, modified polyamides and mixtures thereof, preferably rheological additive is fumed silica.

A rheological additive may be present from 0.01 to 15% by weight of the total weight of the composition, preferably from 0.1 to 12% and more preferably from 0.5 to 10%.

When the quantity of a rheological additive is too high the viscosity may increase too much and there may be a negative impact on conductivity, whereas too low quantity may not provide desired effect.

The present invention also relates to a cured product of the electrically conductive composition according to the present invention.

The composition according to the present invention may be cured thermally. The composition according to the present invention can be cured in 90 seconds at 180° C. However, the Applicant has found out that the adhesion strength can even develop further upon longer curing times at temperatures from 50° C. to 200° C.

The present invention encompasses the use of the electrically conductive composition according to the present invention on a solar cell and/or in a photovoltaic module, preferably as an interconnection material in a solar cell and/or a photovoltaic module.

The present invention encompasses the use of cured electrically conductive composition according to the present invention on a solar cell and/or in a photovoltaic module, preferably as an interconnection material in a solar cell and/or a photovoltaic module.

The electrically conductive adhesive according to the present invention having the required electrical and mechanical properties can be used in a shingled photovoltaic module wherein the crystalline silicon based solar singles are attached to each other by using the electrically conductive adhesive.

Preferably, the electrically conductive composition according to the present invention is used as an interconnection material in the photovoltaic module, wherein the solar cells are shingled. A shingled structure is illustrated in FIG. 3.

The present invention also relates to a photovoltaic module, comprising a series-connected string of two or more solar cells in a shingle pattern having an electrically conductive bonding between said two or more solar cells, wherein said electrically conductive bonding is formed with an electrically conductive composition according to the present invention.

In one embodiment, the electrically conductive composition according to the present invention may be used to bond ribbons to the solar cells as shown in FIG. 2 or to connect ribbons or conductive back sheets onto a back contact solar cell.

The electrically conductive composition according to the present invention can be applied by dispensing, jetting or printing.

The present invention encompasses a photovoltaic module according to the present invention, wherein said electrically conductive composition is applied by dispensing, jetting or printing.

EXAMPLES

The example compositions are prepared by mixing all ingredients together to form a homogenous mixture.

Test Methods:

Viscosity

Viscosity was measured on a Rheometer from TA instruments Rheometer HR-1 or Q-2000; discovery HR-1 or -2 or -3 using a plate-plate geometry with a 2 cm in diameter plate at a 200-micron gap and shear rates of 1.5 $s^{-1}$ or 15 $s^{-1}$. Viscosity units are reported in Pa·s.

GPC

Sample preparation—About 5 mg sample was weighed in a 2 ml vial. 1 ml toluene was added. To ensure the sample to dissolve and relax sufficiently in toluene, the sample solution rested at room temperature for more than 12 hours. Finally, the sample vial was agitated before GPC analysis.

Gel permeation chromatography (GPC) were conducted using toluene as the mobile phase on Shimadzu HPLC system (Shimadzu Co., Kyoto, Japan) consisting of RID-10A refractive index detector, LC-20AB pump, SIL-20A autosampler, CTO-20A column oven, and CBM-20A control mode. The system was equipped with one Polypore guard column and two Polypore GPC columns (Agilent Technologies, Santa Clara, CA, USA). The flow rate was set to 1.0 mL/min. The temperature of the column oven is 35° C. The injection volume is 100 ml. Empower 3 (Waters Co., Milford, MA, USA) was utilized as the sample processing software.

Si-vinyl to Si—H Ratio by Proton NMR (Nuclear Magnetic Resonance) Experimental Conditions The NMR sample was prepared by suspending approximately 1 g of the ECA in 3 mL of $CDCl_3$, allowed to stand at room temperature for 30 minutes, centrifuge at 3500 rpm and the organic layer removed for NMR analysis.

Proton NMR spectra were acquired on a Bruker Avance III HD 400 (9.4 T) NMR spectrometer at 400.13 MHz, using a 30 degree rf pulse, relaxation delay of 20 seconds and at a probe temperature of 303K.

The NMR instrument measures the direct molar response of the vinyl and Si—H functionalities with protons at chemical shifts between 4.4-5.0 ppm (Si—H) and 5.6-6.2 ppm (Si-vinyl). The Si-vinyl integral value was assigned as 1.000 in each sample spectrum and the Si—H integral value was relative to that.

For example 9, a Si-vinyl integral value of one gave an Si—H integral value of 0.668 and as such an Si—H/Si-vinyl ratio of 2.0 (=3*0.668) is determined for this material meaning that for 1 equivalent of vinyl ($SiCH=CH_2$), 2 equivalents of Si—H groups are present in the adhesive.

Volume Resistivity (VR)

Samples were prepared for the compositions according to the examples above and deposited on a glass plate (by drawing down a strip of material onto the surface of a glass slide with strip dimensions of about 5 cm in length, 5 mm in width and about 50 microns in thickness) and cured and dried (for 15 minutes at 150° C. in a box oven). Glass plates were cooled to room temperature, before measurement.

Volume resistivity was calculated from equation VR= (width of the sample (cm)×thickness of the sample (cm)× Resistance (Ohm))/length of the sample (cm). Where the resistance in ohm was measured by using a Keithley 2010 multimeter and a 2-point resistance probe. Volume resistivity units are reported in Ohm·cm Electrical Contact Resistance (CR)

Figure 4:
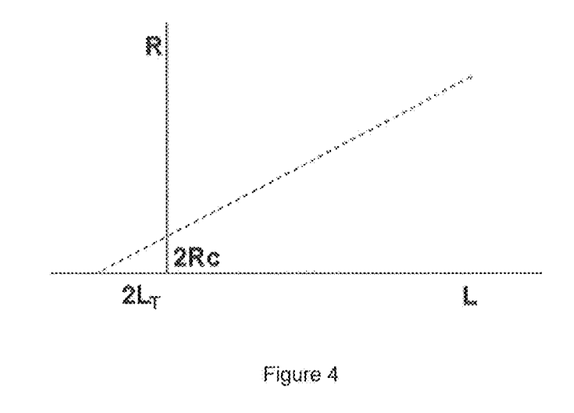
FIG. 4 illustrates a plot of the electrical contact resistance.

The electrical contact resistance was determined by depositing the conductive adhesive on a ceramic plate in 0.5 cm wide track of adhesive. A TLM structure was obtained by contacting 7 Ag plated Cu tabs (1.2 mm wide, 1-micron Ag coating) to the adhesive track, wherein the contact tabs exhibit increasing distances between the contact tabs going from about 3 mm to about 18 mm. After cure (for 15 minutes at 150° C. in a box oven) the resistance between the neighbouring contact tabs was measured by using Keithley four-point probes and a Keithley 2750 multimeter and plotted as a function of the distance. The contact resistance value is the half of the intercept from the curve obtained from that plot. The average contact resistance (arithmetic average) is reported in mohm. If no linear relation could be found because of bad ohmic contacts meaning a rsq value of less than 0.9, "no fit" was mentioned. (See e.g. FIG. 4.)

The stability of the electrical contact resistance was determined by accelerated ageing testing (−40,85° C. thermal cycling) using the TLM test setup as described above. TC500 indicates the result after 500 cycles with temperatures in one cycle changed from −40° C. to 85° C. and back to −40° C.

Die Shear Strength (DSS)

Sample are prepared by depositing a 2 mm wide and 50-micron thick track on a ceramic board. 12 pieces of 2 by 2 mm Silicon dies are place on the adhesive track with a Fineplacer with 0 pressure. The samples are cured for 15 min 150° C. in a box oven.

The Die Shear Strength is measured with a Dage 4000 Optima Bondtester. This determination is based on measuring the force needed to remove the die.

Table 1 lists ingredients for comparative examples 1 and 2 and examples according to the present invention 3-7.

TABLE 1

| Material | Function | Ex. 1 Comparative | Ex. 2 Comparative | Ex. 3 | Ex. 4 | Ex. 5 | Ex. 6 | Ex. 7 |
| --- | --- | --- | --- | --- | --- | --- | --- | --- |
| Stoichiometry Si—H/vinyl - theoretical | | 0.8 | 0.8 | 1.5 | 2 | 2 | 1.6 | 2.0 |
| Raw material name | Function | Wt % | Wt % | Wt % | Wt % | Wt % | Wt % | Wt % |
| Silopren U grundmishung H6 from Momentive Performance Materials | Silicone resin | 37.419 | | 28.18 | 24.62 | 28.86 | 16.75 | 23.83 |
| Andisil VQM 1 from AB speciality scones | | | | 36.74 | | | | 16.48 |
| Silmer VQ20 from Siltech corporation | | | | | 1.21 | | | |
| Silopren U vernetzer 430 from Momentive Performance Materials | Scone cross-linker | 2.872 | 3.062 | 4.06 | 6.89 | 5.91 | 5.17 | 4.88 |
| Silmer HQ20 from Siltech corporation | | | 0.42 | 0.34 | | | | |
| Silbond 40 from Silbond Corporation | solvent | 0.77 | 0.84 | 0.62 | 0.54 | 0.66 | 0.695 | 0.55 |

TABLE 1-continued

| Material | | Ex. 1 Comparative | Ex. 2 Comparative | Ex. 3 | Ex. 4 | Ex. 5 | Ex. 6 | Ex. 7 |
|---|---|---|---|---|---|---|---|---|
| Silopren S 50 from Momentive Performance Materials | | 1.13 | 1.23 | 0.91 | 0.79 | 0.98 | 1.02 | 0.81 |
| SIP 6829.2 from Gelest | Catalyst | 0.13 | 0.14 | 0.10 | 0.09 | 0.11 | 0.12 | 0.09 |
| 2-methyl-3-butyn-2-ol from Acros | inhibitor | 0.04 | 0.04 | 0.03 | 0.03 | 0.03 | 0.03 | 0.03 |
| Vinyl-methyl-D4 from Momentive | | 0.51 | 0.56 | 0.41 | 0.36 | 0.44 | 0.46 | 0.36 |
| Silquest A187 from Momentive Performance Materials | Adhesion promotor | 0.60 | | 0.48 | 0.42 | 0.52 | 0.54 | 0.43 |
| SF-22 from Ames Goldsmith | Silver | | | | | | | 49.51 |
| AA364-2 from Metalor | | 40.55 | 40.85 | 46.48 | 46.33 | 44.83 | 42.66 | 16.50 |
| KP84 from Ames Goldsmith | | 13.52 | 13.62 | 15.49 | 15.44 | 14.94 | 14.11 | |
| K1332P from Metalor | | 2.46 | 2.48 | 2.82 | 2.954 | 2.7 | 2.57 | 3.01 |

Table 2 lists properties of the comparative examples and examples according to the present invention.

TABLE 2

| Properties | | Ex. 1 Comparative sample | Ex. 2 Comparative sample | Ex. 3 | Ex. 4 | Ex. 5 | Ex. 6 | Ex. 7 |
|---|---|---|---|---|---|---|---|---|
| Stoichiometry Si—H/vinyl - theoretical | | 0.8 | 0.8 | 1.5 | 2 | 2 | 1.6 | 2.0 |
| Stoichiometry Si—H/vinyl - NMR | | 0.7 | | 1.5 | 2 | 2.1 | 1.5 | |
| Viscosity at 15 $s^{-1}$ | Pa·s | 75 | 12.4 | 33 | 29 | 28 | 16 | 12.5 |
| DSS - 15 min 150° C. | g | 366 | 243 | 1300 | 1322 | 1112 | 1052 | 1245 |
| VR -15 min 150° C. | Ohm.cm | $1.8 \cdot 10^{-3}$ | $5.3 \cdot 10^{-3}$ | $1.3 \cdot 10^{-3}$ | $2.0 \cdot 10^{-3}$ | $1.9 \cdot 10^{-3}$ | $4.6 \cdot 10^{-3}$ | $2.5 \cdot 10^{-3}$ |
| CR- 15 min 150° C. initial | mOhm | — | — | 16 | 33 | 11 | 6 | 19 |
| CR- 15 min 150° C. after TC500 | mOhm | — | — | 28 | — | 29 | — | 19 |

Table 3 lists ingredients for comparative example 8 and examples according to the present invention 9-10.

TABLE 3

| Material | | Ex. 8 Comparative example | Ex. 9 | Ex. 10 |
|---|---|---|---|---|
| Stoichiometry Si—H/vinyl - theoretical | | 6 | 2.0 | 1.5 |
| Raw material name | Function | Wt % | Wt % | Wt % |
| Silicone resin from KunShan BingDE Electronics&Technology Corporation | Silicone resin | 7.51 | 15.02 | 17.16 |
| Silicone cross-linker from KunShan BingDE Electronics&Technology Corporation | Silicone crosslinker | 22.53 | 15.02 | 12.87 |
| BCA from Sigma-Aldrich | solvent | | | 2.73 |
| D60 from Miosonio Co. Ltd. | | 2.56 | 2.56 | |
| SIP 6831.2 from Gelest | catalyst | 0.045 | 0.045 | 0.045 |
| Silquest A187 from Momentive Performance Materials | Adhesion promoter | 0.15 | | |
| KH-570 from Qingdao hengda Zhong Cheng Technology Co | | | 0.15 | |
| Blemmer GS from Nippon Oil & Fat Corporation (NOF) | | | 0.063 | 0.063 |
| K1322P, AA364-2 from Metalor and KP84 from Ames Goldsmith | Silver | 67.30 | 67.30 | 67.12 |

Table 4 lists properties for comparative example 8 and examples according to the present invention 9-10.

TABLE 4

| Properties | | Ex. 8 Comparative example | Ex. 9 | Ex. 10 |
| --- | --- | --- | --- | --- |
| Stoichiometry Si—H/vinyl - theoretical | | 6 | 2.0 | 1.5 |
| Stoichiometry Si—H/vinyl - NMR | | | 2.0 | |
| Viscosity at 15 s$^{-1}$ | Pa · s | 33 | 40 | 45 |
| DSS - 90 s 180° C. | kg | 0.72 | 1.53 | 1.46 |
| DSS - 15 min 150° C. | kg | 1.05 | 2.11 | 2.08 |
| VR - 15 min 150° C. | Ohm · cm | 5.3 10$^{-3}$ | 1.5 10$^{-3}$ | 2.1 10$^{-4}$ |
| CR - 15 min 150° C. | mOhm | 97 | 22 | 19 |

What is claimed is:

1. An electrically conductive composition consisting of:
   a. a silicone resin comprising at least one vinyl-group present in amounts of 11% to 35% by weight of the conductive composition;
   b. a silicone cross-linker having at least one Si—H group;
   c. electrically conductive particles present in amounts of 50% to 70% by weight of the conductive composition;
   d. a solvent present from 0.1 to 10% by weight of the conductive composition;
   e. an adhesion promoter;
   f. a catalyst;
   g. an inhibitor; and
   h. optionally, rheological additives, conductivity promotors, dispersing agents, anti-bleed agents, defoamers and mixtures thereof, wherein the Si—H groups and the vinyl-groups are present in a ratio equal to or greater than 1.3 but equal or less than 10; the composition has a die strength at 150° C. of 1-1.53 kg and an electrical contact resistance after 500 cycles of thermal cycling of 19-29 mOhms from −40° C. to 85° C. and back to −40° C.; and wherein the silicone resin is selected from the group consisting of

(1)

wherein a is 1-1000, and $R_1$, $R_2$, $R_3$, $R_4$ are same or different and independently selected from the group consisting of methyl-group, ethyl-group and phenyl-group;

(2)

wherein b+c+x is 1-1000, and $R_5$, $R_6$, $R_7$, $R_8$, $R_9$ and $R_{10}$ are same or different and independently selected from the group consisting of methyl-group, ethyl-group and phenyl-group;

(3)

wherein d+e is 1-1000, and $R_{11}$, $R_{12}$, $R_{13}$, $R_{14}$, $R_{15}$, $R_{16}$, $R_{17}$ are same or different and independently selected from the group consisting of methyl-group, ethyl-group and phenyl-group;

(4)

wherein f is 1-1000, and $R_{18}$, $R_{19}$, $R_{20}$, $R_{21}$, $R_{22}$, $R_{23}$, $R_{24}$, $R_{25}$, $R_{26}$, $R_{27}$, $R_{28}$ are same or different and independently selected from the group consisting of methyl-group, ethyl-group and phenyl-group;

(5)

wherein g+h is 1-1000, and $R_{29}$, $R_{30}$, $R_{31}$, $R_{32}$ are same or different and independently selected from the group consisting of methyl-group and phenyl-group;

(6)

wherein R' is selected from the group consisting of vinyl, methyl-group, ethyl-group, phenyl-group and mixtures thereof, R" is selected from the group consisting of methyl-group, ethyl-group, phenyl-group, vinyl-group and mixtures thereof;

(7)

wherein i+j is 1-1000, and $R_{33}$, $R_{34}$, $R_{35}$, $R_{36}$, $R_{37}$, $R_{38}$, $R_{39}$, $R_{40}$, $R_{41}$ are same or different and independently selected from the group consisting of methyl-group and phenyl-group; and mixtures thereof.

2. An electrically conductive composition according to claim 1, wherein said silicone crosslinker comprising at least one Si—H group is selected from the group consisting of

(8)

wherein k is 1-1000 and $R_{42}$ and $R_{43}$ are same or different and independently selected from the group consisting of H, methyl-group, ethyl-group, phenyl-group and mixtures thereof;

(9)

wherein I is 1-1000 and $R_{44}$ is selected from the group consisting of H, methyl-group, ethyl-group, phenyl-group and mixtures thereof;

(10)

(11)

wherein m is 1-1000;

(12)

wherein n+o is 1-1000 and $R_{45}$, $R_{46}$, $R_{47}$ are same or different and independently selected from the group consisting of H, methyl-group, ethyl-group and phenyl-group;

(13)

wherein p+q is 1-1000 and $R_{48}$ and $R_{49}$ are same or different and selected from the group consisting of H, methyl-group, ethyl-group and phenyl-group;

(14)

wherein r+s is 1-1000 and $R_{50}$, $R_{51}$, $R_{52}$, $R_{53}$, $R_{54}$, $R_{55}$, $R_{56}$, $R_{57}$, $R_{58}$, $R_{59}$, $R_{60}$, $R_{61}$ are same or different and independently selected from the group consisting of H, methyl-group, ethyl-group and phenyl-group;

and mixtures thereof.

3. An electrically conductive composition according to claim 1 wherein said silicone crosslinker comprising at least one Si—H group is present in an amount of from 0.1 to 30% by weight of the total weight of the composition.

4. An electrically conductive composition according to claim 1 wherein said electrically conductive particles are selected from the group consisting of silver, nickel, carbon, carbon black, graphite, graphene, copper, gold, platinum, aluminium, iron, zinc, cobalt, lead, tin alloys, silver coated copper, silver coated graphite, silver coated polymers, silver coated aluminium, silver coated glass, silver coated carbon, silver coated boron nitride, silver coated aluminium oxide, silver coated aluminium hydroxide and mixtures thereof.

5. An electrically conductive composition according to claim 1, wherein said adhesion promoter is selected from the group consisting of epoxy functional silanes, cycloaliphatic epoxy silanes, (meth)acrylic functional silanes, carboxylates, epoxy acrylates, and mixtures thereof.

6. An electrically conductive composition according to claim 1, wherein said adhesion promoter is present from 0.05 to 2.5% by weight of the total weight of the composition.

7. An electrically conductive composition according to claim 1, wherein said solvent has a boiling point 75° C. or greater at 1 atm (760 mm Hg).

8. A cured product of the electrically conductive composition according to claim 1.

9. A photovoltaic module, comprising a series-connected string of two or more solar cells in a shingle pattern having an electrically conductive bonding between said two or more solar cells, wherein said electrically conductive bonding is formed with an electrically conductive composition according to claim 1.

10. A photovoltaic module according to claim 9, wherein said electrically conductive composition is applied by dispensing, jetting or printing.

11. An electrically conductive composition according to claim 1, wherein the rheological additives are present in the range of from 0.01 to 15% by weight of the total weight of the composition.

* * * * *